United States Patent [19]

Waddington et al.

[11] 4,027,096

[45] May 31, 1977

[54] ELECTRICAL DEVICE HOUSING

[75] Inventors: William T. Waddington, Fanwood; Harold F. Jenkins, Irvington, both of N.J.

[73] Assignee: Amerace Corporation, New York, N.Y.

[22] Filed: Feb. 25, 1975

[21] Appl. No.: 552,742

[52] U.S. Cl. .............................. 174/52 R; 220/4 E; 339/74 R; 339/208
[51] Int. Cl.² ........................................ H05K 5/00
[58] Field of Search ................. 174/52 R; 220/4 E; 339/206 R, 206 L, 206 P, 207 R, 207 S, 208, 209, 210 R, 210 M, 210 T, 74 R, 253 R, 254 R, 255 R, 255 A

[56] References Cited

UNITED STATES PATENTS

| | | | |
|---|---|---|---|
| 1,945,664 | 2/1934 | Smith | 339/74 R X |
| 1,976,501 | 10/1934 | James | 339/74 R |
| 2,710,949 | 6/1955 | Happe et al. | 339/210 R X |
| 3,112,148 | 11/1963 | Wochner | 339/208 X |
| 3,179,915 | 4/1965 | Klassen | 339/208 X |
| 3,233,210 | 2/1966 | Knowles | 339/208 X |
| 3,821,691 | 6/1974 | Reimer | 339/206 R X |
| 3,828,300 | 8/1974 | Codrino | 339/74 R |

Primary Examiner—J. V. Truhe
Assistant Examiner—D. A. Tone
Attorney, Agent, or Firm—S. Michael Bender; Ken Richardson

[57] ABSTRACT

A housing for receiving an electrical device and connecting the device into an electrical circuit has a pair of identical housing members joined together along confronting interior faces by complementary catch elements formed integral with the housing members. The electrical device is received within a receptacle in the housing and captured in place in the receptacle by the engagement of a blade contact in the device with a tooth projecting into a socket of a complementary connector in the housing.

13 Claims, 5 Drawing Figures

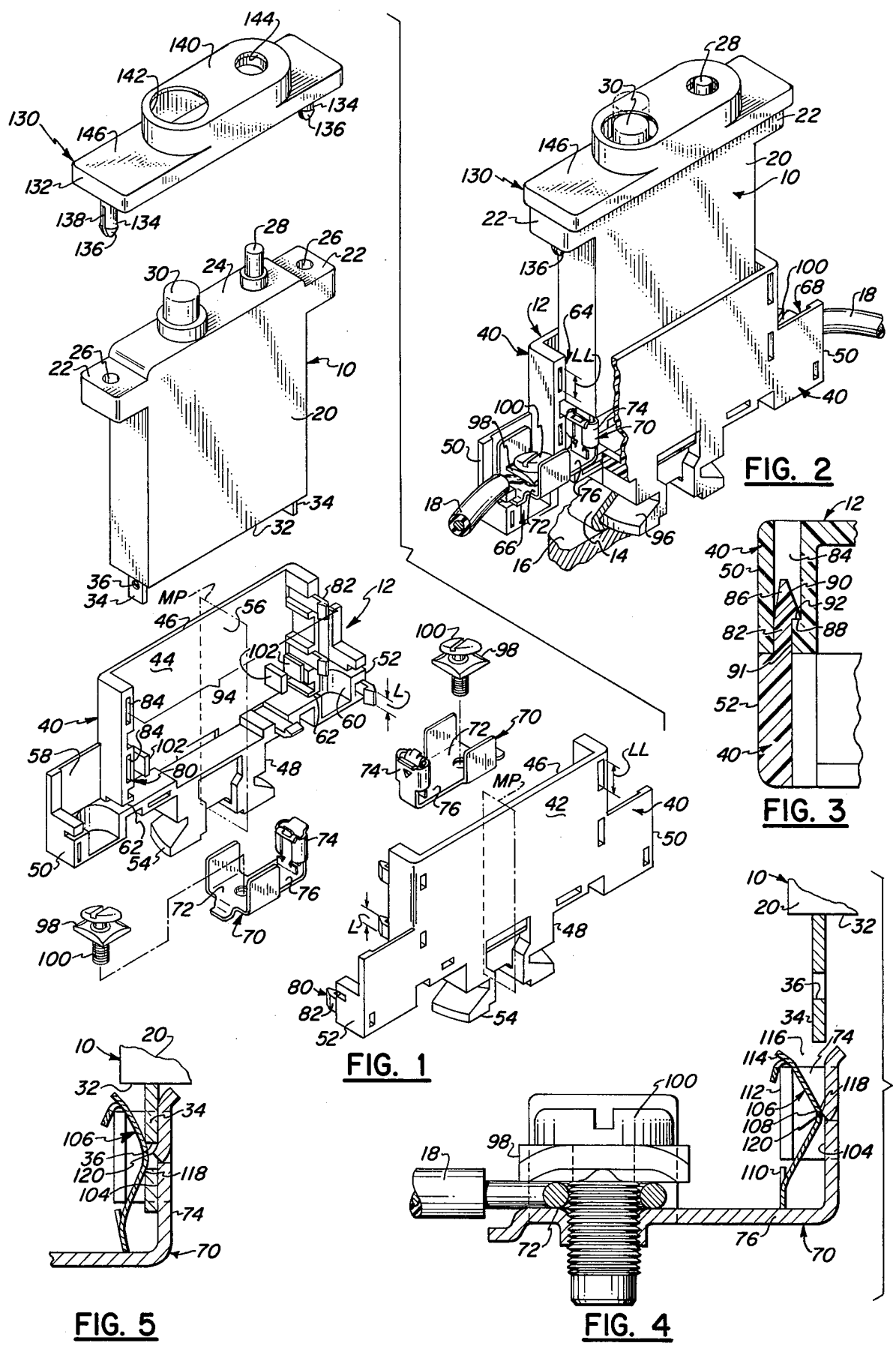

ELECTRICAL DEVICE HOUSING

The present invention relates generally to electrical connectors and pertains, more specifically, to a housing for receiving an electrical device and connecting the device into an electrical circuit.

Electrical connectors have been developed for mounting and electrically connecting a variety of electrical devices in electrical circuits. An example of such an installation is the mounting of a circuit breaker in a control panel. More recently, a need has arisen for mounting circuit breakers upon a channel provided in machine tool control panels. It is desired that the circuit breaker be attached merely by inserting or plugging the circuit breaker into a housing affixed within the channel. Once installed in the housing, the circuit breaker should be captured in the housing so that selective removal is not permitted. The housing should be accessible easily for installation of the circuit breaker and should include means for making good, sound electrical connections between the circuit breaker and the housing and between the housing and the external electrical circuit. These connections should withstand vibration, as well as any direct pull on external wires or on the circuit breaker itself, without interruption of electrical current and without a significant increase in electrical resistance.

It is desirable that the housing allow installation of the circuit breaker in the field by the end user so as to enable selection of a circuit breaker having the current rating needed in a particular application. In this manner it will not be necessary to stock pre-assembled housings and circuit breakers in a variety of current ratings. Thus, only the housings themselves need be stocked and the circuit breakers can be inserted at a later time, perhaps even after all wiring is completed and after the exact required current rating is determined.

In addition, there should be provided means for preventing accidental manual tripping of the circuit breaker, means to enable ready recognition of a tripped condition and means to enable the marking of specific identification in connection with each circuit breaker.

It is therefore an object of the invention to provide a housing which enables ready reception, connection and mounting of an electrical device, such as a circuit breaker, in an electrical circuit, such as that of a machine tool control panel upon which the circuit breaker is to be mounted.

Another object of the invention is to provide a housing which can be mounted and electrically connected securely in a control panel and which enables subsequent insertion of an electrical device, such as a circuit breaker.

Still another object of the invention is to provide a housing of the type described above and wherein an electrical device, such as a circuit breaker, may be inserted in such a manner as to capture the device in the housing so that the device is not selectively removable from the housing.

A further object of the invention is to provide a housing of the type described above which enables easy access for insertion of an electrical device, such as a circuit breaker, and affords good, sound electrical connections between the device and the housing, and between the housing and the external electrical circuit, which connections are able to withstand vibration as well as any direct pull on external wires or upon the device itself, without interruption of electrical current and without a significant increase in electrical resistance.

A still further object of the invention is to provide a housing of the type described above and which enables ready installation of an electrical device in the field.

Another object of the invention is to provide means for use in connection with a housing of the tupe described above to enable the marking of specific identification of the device installed in the housing and, where such a device is a circuit breaker, for preventing accidental manual tripping of the circuit breaker and for enabling ready recognition of a tripped condition.

Still another object of the invention is to provide a housing of the type described above, the construction of which is simplified, and thereby rendered more economical, by employing identical housing members and identical electrical connector elements in a single assembled housing so as to reduce the number of different component parts which need be fabricated to produce a single housing.

The above objects, as well as still further objects and advantages are attained by the invention which may be described briefly as a housing for receiving an electrical device and connecting the device into an electrical circuit, the housing comprising a pair of identical housing members, each having an interior face including at least one recessed portion, each housing member including at least one set of two complementary catch elements extending transverse to the face, the catch elements of a set each being located in opposite directions from a medial plane passing laterally through the member transverse to the interior face and spaced equidistant from the medial plane such that upon assembly of one of the housing members with the other, with the interior faces in face-to-face relationship and the medial planes of the housing members superimposed, corresponding complementary catch elements of the housing members will be engaged to secure the housing members to one another in an assembled housing, with the recessed portions establishing a receptacle therein for the electrical device.

The invention will be more fully understood, while additional objects and advantages will become apparent, by reference to the following detailed description of an embodiment of the invention illustrated in the accompanying drawing, in which:

FIG. 1 is an exploded perspective view of a housing constructed in accordance with the invention, together with an electrical device to be received in the housing;

FIG. 2 is a perspective view of the housing after assembly and insertion of the electrical device;

FIG. 3 is an enlarged, fragmentary cross-sectional view illustrating a catch for holding the housing members in assembled relationship;

FIG. 4 is an enlarged, longitudinal cross-sectional view of an electrical contact of the housing; and FIG. 5 is a fragmentary, cross-sectional view of a portion of the electrical contact shown with a contact blade of the electrical device received in the socket of the contact. Referring now to the drawing, and especially to FIGS. 1 and 2 thereof, an electrical device, shown in the form of a circuit breaker 10, is to be received within a housing 12 for mounting within a channel 14 of a machine tool 16 and for connection into an electrical circuit represented by wires 18.

Circuit breaker 10 has a generally parallelepipedal body 20 with tabs 22 extending from the body adjacent the top 24 thereof, each tab 22 including a hole 26 passing through the tab. Projecting from the top 24 of the body 20 are a manual tripping push-button 28 and a reset push-button 30. Projecting from the bottom 32 of the body 20 are electrical contacts in the form of parallel blades 34, each blade having an aperture 36 passing through the blade. Circuit breaker 10 currently is commercially available and may be obtained in a variety of current ratings, while remaining in the same size and configuration.

In order to mount circuit breaker 10 upon machine tool 16 and at the same time connect circuit breaker 10 between wires 18, housing 12, which is constructed in accordance with the invention, is provided for receiving the circuit breaker 10. Housing 12 has a pair of identical housing members 40, each having an exterior face 42, an interior face 44, a top 46, a bottom 48 and opposite ends 50 and 52 spaced longitudinally from one another. A pedestal portion 54 depends from bottom 48.

A first recessed portion 56 in interior face 44 extends upwardly from the bottom 48, where the recessed portion 56 is closed, and is open at the top 46. Further recessed portions in the form of second and third recessed portions 58 and 60 are located in the interior face 44, one adjacent each end 50 and 52 of each housing member 40. A passage 62 passes between each second and third recessed portion 58 and 60 and the first recessed portion 56.

In order to assemble the housing members 40 to establish housing 12 which will receive circuit breaker 10, the housing members 40 are joined together with the interior faces 44 in face-to-face relationship, the tops 46 and bottoms 48 being juxtaposed with one another and each of the ends 50 and 52 of one housing member 40 being juxtaposed with an opposite end 52 and 50, respectively, of the other housing member. When so joined, the housing members 40 provide a receptacle 64 established by first recessed portions 56 and cavities 66 and 68 established by second and third recessed portions 58 and 60 of each housing portion 40.

Prior to bringing together the two housing members 40 in the above-described assembled relationship, a pair of identical electrical connector elements 70 are located within one or the other of the housing members so as to be captureed within the housing established by assembly of the housing members. Each connector element 70 includes a terminal portion 72 and a socket portion 74 interconnected by a strap 76. The strap 76 of each connector element 70 is located in a corresponding passage 62 with terminal portion 72 lying within one of the second and third recessed portions 58 and 60 and socket portion 74 lying in the first recessed portion 56.

As best seen in FIGS. 2 and 3, as well as in FIG. 1, in order to secure the two housing members 40 together in the above-described assembled relationship, the housing members 40 are provided with securing means in the form of catches 80, each catch having two complementary catch elements shown in the form of a projection 82 projecting from interior face 44 of each housing member 40 in a lateral direction and a complementary opening 84 extending laterally into each housing member. Projection 82 includes a head 86 with a locking shoulder 88 and a ramp 90. Locking shoulder 88 extends in a direction transverse to the direction in which the projection 82 extends, i.e., perpendicular to the paper as viewed in FIG. 3, and has a length in that direction equal to the length L of the cross-sectional area of the projection. Opening 84 includes a ledge 91 with a complementary locking shoulder 92 which also extends in the same transverse direction, i.e., along the longer dimension, or length LL, of the opening as viewed in FIGS. 1 and 2. Preferably, the longer dimension, or length LL, of the opening 84 is greater than length L of the cross-sectional area of the projection 82 by an amount sufficient to enable flexure of the ledge 91, by virtue of dilation of the opening as the projection enters the opening, to enable the head 86 to pass over the ledge 91. Once the head 86 passes over the ledge 91, shoulder 88 will confront complementary shoulder 92 to preclude withdrawal of the projection 82 from the opening 84, thereby locking together the housing members 40. The degree of dilation of opening 84 is related to the particular material chosen for the housing member and to the dimensions of the opening. Thus, increasing or decreasing the length LL of the opening will result in a corresponding increase or decrease in the dilation of the opening.

Returning now to FIG. 1, it will be seen that each housing member 40 is provided with a plurality of sets 94 of two complementary catch elements, each set 94 including one projection 82 and one open 84. The projection 82 and opening 84 of each set 94 are located in opposite directions from a medial plane MP passing laterally through the housing member 40 transverse to interior face 44 and are spaced equidistant from the medial plane such that upon assembly of the housing members 40 with the medial planes of the housing members superimposed, a projection 82 of one set 94 on one housing member will enter the opening 84 of the corresponding set 94 on the other housing member, thereby securing together the two housing members in the above-described assembled relationship. Preferably, the housing members are symmetrical about the medial plane, with the exception of the complementary configuration of the catch elements of each set of catch elements.

Upon assembling the two housing members 40, with the two electrical connector elements 70 captured therein, the assembly can be affixed to machine tool 16 by inserting the pedestal 96, established by pedestal portions 54, into the channel 14. Wires 18 are than electrically connected to the terminal portions 72 of the connector elements 70 by clamping each wire 18 beneath a clamping element 98 carried by a clamping screw 100 threaded into each terminal portion 72 (also see FIG. 4) within a respective cavity 66 and 68 of housing 12.

The selected circuit breaker 10 can then be installed in the housing 12 by merely sliding the body 20 of the circuit breaker 10 downwardly into the receptacle 64 until the bottom 32 of the body 20 comes to rest against posts 102 which project into the receptacle. The parallel blades 34 of the circuit breaker 10 are aligned with the socket portions 74 of electrical connector elements 70 so that the blades 34 will enter the socket portions 74 upon insertion of the circuit breaker 10 into the receptacle 64, thereby making an electrical connection between each blade and the corresponding connector element and placing the circuit breaker in the electrical circuit represented by wires 18.

Turning now to FIGS. 4 and 5, the socket portion 74 of each connector element 70 includes within it means for resiliently biasing the blade 34 of the circuit breaker toward one wall of the socket portion. Thus, means for resiliently biasing the blade 34 against wall 104 of socket portion 74 is illustrated in the form of a metallic leaf spring 106 which is seated in the socket portion 74 and includes a spring finger 108. A pair of tangs 110 project from spring 106 adjacent one end of finger 108 and confront the opposite walls 112 of the socket portion 74 to capture the spring 106 within the socket portion 74. As best seen in FIG. 4, the upper end portion 114 of the spring finger 108 flares away from the wall 104 of the socket portion 74, thus establishing a funnel-like guideway at the entrance 116 into the socket portion for purposes of facilitating insertion of circuit breaker 10 by guiding blade 34 into appropriate seating arrangement between spring 106 and wall 104.

Once the blade 34 is seated in the socket portion 74, positive electrical contact pressure is assured between the blade 34 and wall 104 by virtue of the resilient bias of central portion 118 of spring 106 which is bowed toward wall 104. Furthermore, wall 104 is provided with retention means in the form of a tooth 120 which, upon proper seating of the circuit breaker 10 in the receptacle 64 and blades 34 within socket portions 74, as seen in FIG. 5, enters the corresponding aperture 36 in the blade 34 to retain the blade in the socket portion and thus capture the circuit breaker 10 within the receptacle 64. Spring 106 assures engagement of tooth 120 in aperture 36. Hence, once the circuit breaker is installed, it becomes captured and cannot be removed by merely withdrawing the circuit breaker body 20 from the receptacle 64.

Returning, once again, to FIGS. 1 and 2, the housing includes a cap 130 which may be provided for preventing accidental manual tripping of the circuit breaker 10, for enabling ready recognition of a tripped condition, and for enabling marking of specific identification for the particular circuit breaker 10.

Cap 130 includes an elongate frame 132 carrying depending pins 134 which have enlarged tapered tips 136 and which are split axially at 138. The spacing between pins 134 corresponds to the spacing between holes 26 so that the frame 132 can be placed over the top 24 of body 20, and tabs 22 thereof, with the pins 134 placed within holes 26. Downward pressure upon cap 130 will cause pins 134 to contract diametrically, by virtue of the splits 138, and enter holes 26, whereupon the frame can be seated upon the top 24 of the body 20 of the circuit breaker 10.

A raised portion 140 of cap 130 carries two openings 142 and 144. The reset push-button 30 enters the larger opening 142 while the manual tripping push-button 28 enters the smaller opening 144. When the circuit breaker 10 is set, or in the "on" position, both push-buttons 28 and 30 are flush with the outside surface of the cap 130, as seen in full lines in FIG. 2. Inadvertent manual tripping of the circuit breaker is precluded since the manual tripping push-button 28 is shielded from externally applied forces by the raised portion 140 of cap 130. Manual tripping can be accomplished only by deliberately inserting a thin, elongate object into opening 144 to actuate the manual tripping push-button 28.

Should the circuit breaker be placed in a tripped condition, the larger, reset push-button 30 will rise and project upwardly from the raised portion 140 of cap 130, as seen in phantom in FIG. 2, thus providing a clear, visual as well as tactile indication of the tripped condition.

Specific identification of the particular electrical circuit represented by wires 18 can be marked upon the sufficient area provided by flat upper surface 146 on the frame 132 of cap 130.

The housing members 40 preferably are fabricated of a synthetic resin material and are molded in a unitary structure. Since both housing members 40 are identical, any number of housings 12 can be assembled from duplicate component parts of the same design. Thus, housing 12 is economical to fabricate. Since only one configuration of housing member 40 need be stocked, the assembly and installation of housings becomes simplified and economical. The particular material chosen for housing members 40 provides the resiliency required for the operation of catches 80, while supplying the necessary dielectric properties. One suitable material is nylon. Cap 130 likewise preferably is molded of a resilient material which supplies the resiliency required for the proper operation of split pins 134. Electrical connector elements 70 are fabricated of a suitable metal.

While particular embodiments of the invention have been shown and described, it is apparent to those skilled in the art that modifications are possible without departing from the spirit of the invention or the scope of the subjoined claims.

The embodiments of the invention in which an exclusive property or privilege is claimed are defined as follows:

1. A housing for receiving an electrical device and connecting the device into an electrical circuit, said housing comprising:
   a pair of identical housing members, each having an interior face including at least one recessed portion;
   each housing member including at least one set of two complementary catch elements extending transverse to said face, the catch elements of a set each being located in opposite directions from a medial plane passing laterally through the member transverse to the interior face and spaced equidistant from the medial plane such that upon assembly of one of said housing members with the other, with the interior faces in face-to-face relationship and the medial planes of the housing members superimposed, corresponding complementary catch elements of the housing members will be engaged to secure the housing members to one another in an assembled housing, with the recessed portions establishing a receptacle therein for the electrical device, and wherein the housing includes at least one electrical connector element therein and each housing member includes at least a further recess in the interior face, said further recess communicating with said one recess such that the electrical connector element, when placed within the further recess, will extend from the further recess into said one recess and, upon said assembly of the housing members, the further recesses will establish a cavity in the housing and the electrical connector element will be captured within the housing and provide an electrical path between said receptacle and said cavity.

2. The invention of claim 1 wherein the electrical device includes at least one contact blade projecting therefrom and having an aperture therein, and wherein:

the electrical connector element includes a terminal portion located in the cavity and a socket portion located in the receptacle to receive the contact blade of the electrical device;

a tooth integral with the connector element and projecting into the socket portion to engage the aperture in the contact blade; and resilient means for biasing the contact blade toward the tooth to assure entry of the tooth into the aperture and capture of the contact blade within the socket portion by the tooth.

3. The invention of claim 2 wherein the resilient means comprises a leaf spring within the socket portion.

4. The invention of claim 3 wherein the leaf spring extends beyond the socket portion and flares outwardly relative to the socket portion to establish a funnel-like guideway at the entrance to the socket portion.

5. A housing for receiving an electrical device and connecting the device into an electrical circuit, said housing comprising:

a pair of identical housing members, each having an interior face including at least one recessed portion;

each housing member including at least one set of two complementary catch elements extending transverse to said face, the catch elements of a set each being located in opposite directions from a medial plane passing laterally through the member transverse to the interior face and spaced equidistant from the medial plane such that upon assembly of one of said housing members with the other, with the interior faces in face-to-face relationship and the medial planes of the housing members superimposed, corresponding complementary catch elements of the housing members will be engaged to secure the housing members to one another in an assembled housing, with the recessed portions establishing a receptacle therein for the electrical device, and wherein the housing includes a pair of identical electrical connector elements therein and each housing includes a pair of identical further recesses in the interior face, said further recesses being located in opposite directions from the medial plane and spaced equidistant therefrom, said further recesses each communicating with said one recess such that the electrical connector elements, when placed one within each further recess, will extend from each further recess into said one recess and, upon said assembly of the housing members, the further recesses will establish a pair of cavities in the housing located in opposite directions from the medial plane and spaced equidistant therefrom and the electrical connector elements will be captured within the housing and provide an electrical path between said receptacle and each cavity.

6. The invention of claim 5 wherein the electrical device includes contact blades projecting therefrom, each contact blade having an aperture therein, and wherein:

each electrical connector element includes a terminal portion located in the respective cavity and a socket portion located in the receptacle to receive a contact blade of the electrical device;

a tooth integral with the connector element and projecting into the socket to engage the aperture in the contact blade; and resilient means for biasing the contact blade toward the tooth to assure entry of the tooth into the aperture and capture of the contact blade within the socket by the tooth.

7. The invention of claim 6 wherein each resilient means comprises a leaf spring within the socket portion.

8. The invention of claim 7 wherein each leaf spring extends beyond each socket portion and flares outwardly relative to the respective socket portion to establish a funnel-like guideway at the entrance to that socket portion.

9. A housing receiving an electrical device and for connecting the device into an electrical circuit, said housing comprising:

a pair of identical housing members, each having an interior face including at least one recessed portion;

each housing member including at least one set of two complementary catch elements extending transverse to said face, the catch elements of a set each being located in opposite directions from a medial plane passing laterally through the member transverse to the interior face and spaced equidistant from the medial plane such that upon assembly of one of said housing members with the other, with the interior faces in face-to-face relationship and the medial planes of the housing members superimposed, corresponding complementary catch elements of the housing members will be engaged to secure the housing members to one another in an assembled housing, with the recessed portions establishing a receptacle therein for the electrical device, wherein the housing includes at least one electrical connector element therein and each housing member includes at least a further recess in the interior face, said further recess communicating with said one recess such that the electrical connector element, when placed within the further recess, will extend from the further recess into said one recess and, upon said assembly of the housing members, the further recesses will establish a cavity in the housing and the electrical connector element will be captured within the housing and provide an electrical path between said receptacle and said cavity, and wherein the electrical device is a circuit breaker having a manual tripping push-button and a reset push-button located adjacent one another and projecting from a surface of the device, the reset push-button projecting further from said surface when the circuit breaker is in a tripped condition than when the circuit breaker is set, and wherein the housing includes a cap, said cap comprising:

a frame; means affixing the frame upon the circuit breaker with at least a portion of the frame coextensive with said surface;

a pair of openings in said portion of the frame for receiving the tripping and reset push-buttons, one within each opening, said portion being raised from said surface of the circuit breaker a distance sufficient to enable both said push-buttons to project no further than the raised portion of the frame when the circuit breaker is set, while enabling the reset push-buttons to project out of the corresponding opening when the circuit breaker is in a tripped condition.

10. The invention of claim 9 wherein the cap includes an external surface adjacent the pair of openings, said external surface having a surface of sufficient area to enable the placement of circuit identification markings thereon.

11. In a housing for receiving an electrical device, connecting the device into an electrical circuit and capturing the device within the housing when so connected, the device including at least one contact blade projecting therefrom and having an aperture therein:

an electrical connector element having a socket portion located in the housing in position to receive the contact blade of the electrical device;

a tooth integral with the connector element and projecting into the socket portion to engage the aperture in the contact blade; and resilient means for biasing the contact blade toward the tooth to assure entry of the tooth into the aperture and capture of the contact blade within the socket portion by the tooth.

12. The invention of claim 11 wherein the resilient means comprises a leaf spring within the socket portion.

13. The invention of claim 12 wherein the leaf spring extends beyond the socket portion and flares outwardly relative to the socket portion to establish a funnel-like guideway at the entrance to the socket portion.

* * * * *